United States Patent
Lin et al.

(10) Patent No.: US 6,751,097 B1
(45) Date of Patent: Jun. 15, 2004

(54) HEAT-RADIATING STRUCTURE CO-USABLE WITH HEAT-RADIATING WINDOW OF A HOUSING OF AN ELECTRONIC APPLIANCE

(75) Inventors: Chiao-Hsin Lin, Taipei (TW); Kuo-Cheng Chu, Taipei (TW); Chih-Kuo Chou, Taipei (TW)

(73) Assignee: Compal Electronics Inc., Taipei (TW)

( * ) Notice: Subject to any disclaimer, the term of this patent is extended or adjusted under 35 U.S.C. 154(b) by 0 days.

(21) Appl. No.: 10/408,560

(22) Filed: Apr. 8, 2003

(51) Int. Cl.[7] ................................................. H05K 7/20
(52) U.S. Cl. ..................... 361/695; 361/690; 361/694; 165/80.3; 165/104.33; 454/184
(58) Field of Search ..................... 361/690–695, 361/709, 710; 257/706, 722; 174/16.1, 16.3; 165/80.3, 185

(56) References Cited

U.S. PATENT DOCUMENTS

| | | | | | |
|---|---|---|---|---|---|
| 5,481,433 | A | * | 1/1996 | Carter ......................... | 361/690 |
| 5,526,875 | A | * | 6/1996 | Lin ............................. | 165/80.3 |
| 6,273,186 | B1 | * | 8/2001 | Ognibene et al. ........... | 165/185 |
| 6,407,916 | B1 | * | 6/2002 | Konstad ...................... | 361/687 |
| 6,529,375 | B2 | * | 3/2003 | Miyahara et al. ........... | 361/697 |
| 6,587,340 | B2 | * | 7/2003 | Grouell et al. .............. | 361/695 |
| 2002/0186532 | A1 | * | 12/2002 | Tomioka et al. ............ | 361/695 |
| 2003/0142476 | A1 | * | 7/2003 | Tomioka et al. ............ | 361/695 |

* cited by examiner

Primary Examiner—Boris Chervinsky
(74) Attorney, Agent, or Firm—Bacon & Thomas, PLLC

(57) ABSTRACT

A heat-radiating structure co-usable with heat-radiating window of a housing of an electronic appliance, including a housing having a rigid wall defining an interior space. At least one side of the rigid wall is formed with an opening or a heat-radiating window and multiple fin units each having a free end and a connecting end connecting with an adjacent fin unit. The fin units are serially arranged to form a fin construction. The adjacent fin units define a pitch or exhaustion gap meeting the safety standard regulated by IEC. The heat-radiating structure further has a fan unit having a connecting section connected with the connecting ends of the fin construction. The fan unit is formed with a flow way for conducting the heat generated in the housing toward the fin construction and dissipated out from the opening or heat-radiating window through the pitch or exhaustion gap.

9 Claims, 4 Drawing Sheets

HEAT-RADIATING STRUCTURE CO-USABLE WITH HEAT-RADIATING WINDOW OF A HOUSING OF AN ELECTRONIC APPLIANCE

BACKGROUND OF THE INVENTION

The present invention is related to an improved heat-radiating structure co-usable with heat-radiating window of a housing of an electronic appliance. The heat-radiating structure includes multiple fin units forming a fin construction assembled in the heat-radiating window of the housing. The pitch between the adjacent fin units meets the safety standard regulated by IEC. Also, the heat-radiating structure can be easily manufactured.

Electronic appliance such as computer having a CPU or microprocessor in a housing will generate high heat. It is necessary to dissipate the heat. Otherwise, the heat will lead to loss of operation power or failure. Also, the heat will shorten the using life of the relevant components. A fan unit is mounted in the housing for circulating the airflow so as to radiate the heat out from the heat-radiating slots formed on the housing.

IEC regulates a safety standard of the heat-radiating slots for preventing alien articles from dropping into the housing through the heat-radiating slots and resulting in short circuit. That is, the width of the heat-radiating slot must be under 1 mm. However, it is a trend to manufacture the housing of the electronic appliance with plastic material instead of metal material so as to facilitate the manufacturing procedure and reduce the weight of the whole electronic appliance and lower manufacturing cost. In practice, it is hard to manufacture the housing by plastic injection molding and control the width of the heat-radiating slot under 1 mm. As shown in FIG. 1, the heat-radiating slot is quite narrow so that it is difficult to manufacture the mold. In addition, when molded, the screens y between the heat-radiating slots x are easy to have irregular edges. This leads to poor appearance. It is time-consuming to process and remove the irregular edges. Therefore, the manufacturing efficiency will be affected and the cost will be increased.

SUMMARY OF THE INVENTION

It is therefore a primary object of the present invention to provide an improved heat-radiating structure co-usable with heat-radiating window of a housing of an electronic appliance. The heat-radiating structure makes the heat-radiating window of the housing of the electronic appliance free from the above regulation so that a manufacturer can easily manufacture the housing.

According to the above objects, the heat-radiating structure of the present invention includes: a housing having a rigid wall defining an interior space, at least one side of the rigid wall being formed with an opening or a heat-radiating window; and multiple fin units each having a free end and a connecting end connecting with an adjacent fin unit. The fin units form a series of fin constructions arranged at intervals. The adjacent fin units define a pitch or exhaustion gap under the standard value of 1 mm regulated by IEC. A fan unit is disposed behind the fin construction. The fan unit has a connecting section at front for connecting with the connecting end of the fin construction. The fan unit is formed with a flow way for conducting the heat generated in the housing toward the fin construction and dissipated out from the opening or heat-radiating window through the pitch or exhaustion gap.

The fin unit can be made of metal material such as aluminum and the total weight of the heat-radiating structure is possibly reduced. The front edges of the free ends of the fin construction are in flush with the inner face of the opening or heat-radiating window of the housing.

The present invention can be best understood through the following description and accompanying drawings wherein:

BRIEF DESCRIPTION OF THE DRAWINGS

FIG. 5-1 is a sectional view of another embodiment of the present invention, showing another relationship between the positions of the fin construction and the opening of the housing of the present invention.

DETAILED DESCRIPTION OF THE PREFERRED EMBODIMENTS

Figure 2:
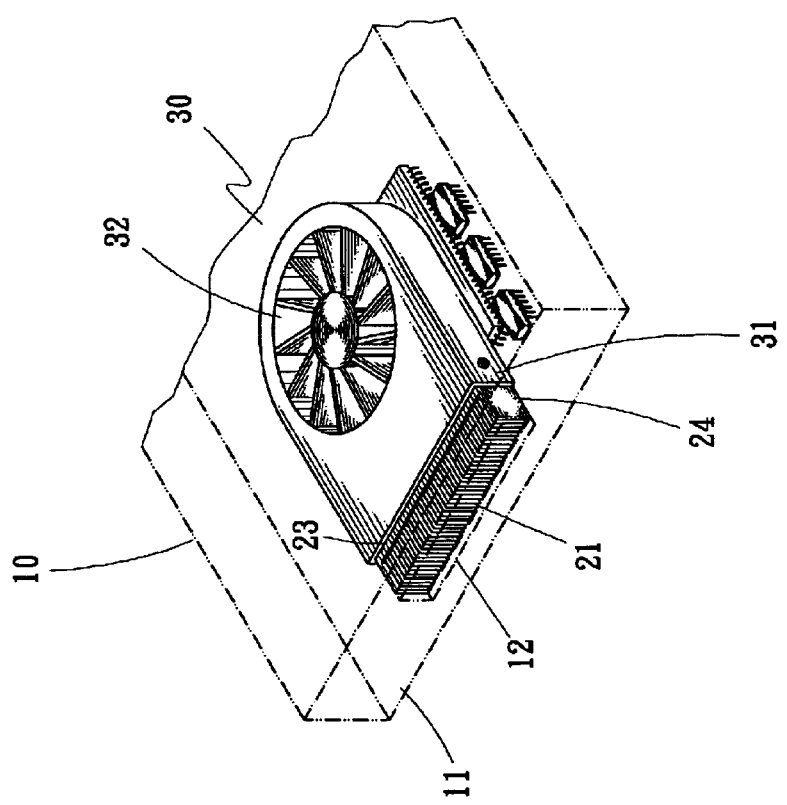
FIG. 2 is a perspective view of the present invention, showing the arrangement of the opening of the housing and the fin construction.
Figure 3:
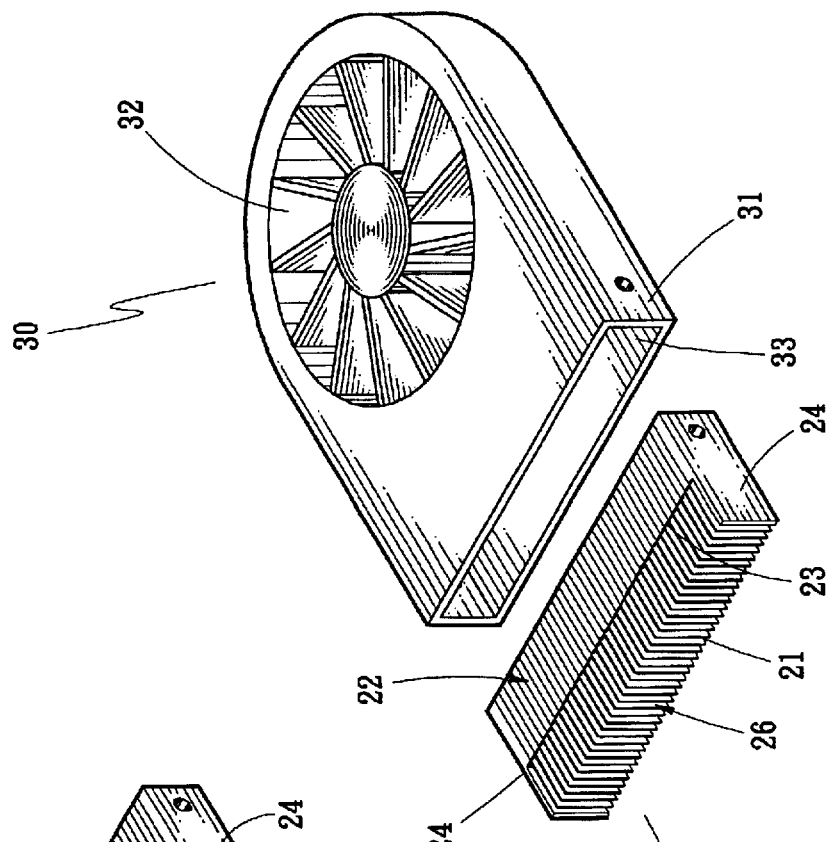
FIG. 3 is a perspective view of the fin construction and fan unit of the present invention.

Please refer to FIGS. 2 and 3. The heat-radiating structure of the present invention includes a housing 10 of an electronic appliance. In a preferred embodiment, the housing 10 is made of a plastic material or the like and has a rigid wall 11 defining an interior space for mounting electronic devices therein. The electronic devices include CPU, microprocessor and other high power electronic components. At least one side of the rigid wall 11 is formed with an opening or a heat-radiating window 12. The present invention further includes multiple fin units 20 each having a free end 21 and a connecting end 22. The connecting end 22 has a bridge section 23 extending in a direction transverse or normal to the axis of the fin unit 20, whereby the fin units 20 form a series of fin constructions 20' arranged at equal intervals in parallel to each other. In a preferred embodiment, the fin unit 20 is made of high thermally conductive metal material such as aluminum. Accordingly, the adjacent fin units 20 can be easily formed to define a pitch or exhaustion gap 26 under the standard value of 1 mm regulated by IEC.

Figure 1:
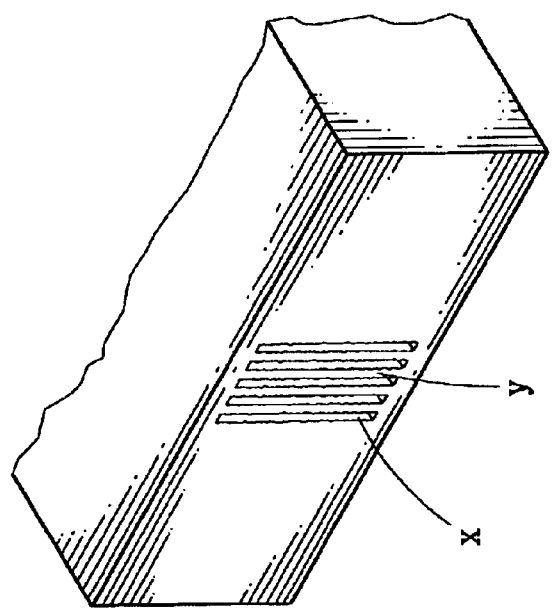
FIG. 1 is a perspective view of a conventional housing of an electronic appliance, which is made by injection molding.
Figure 4:
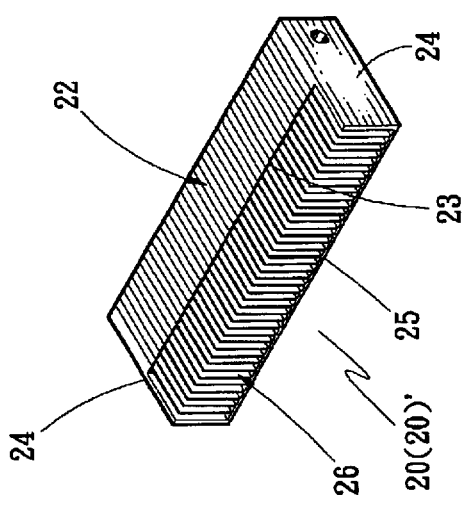
FIG. 4 is a perspective view of another embodiment of the fin construction of the present invention.
Figure 5:
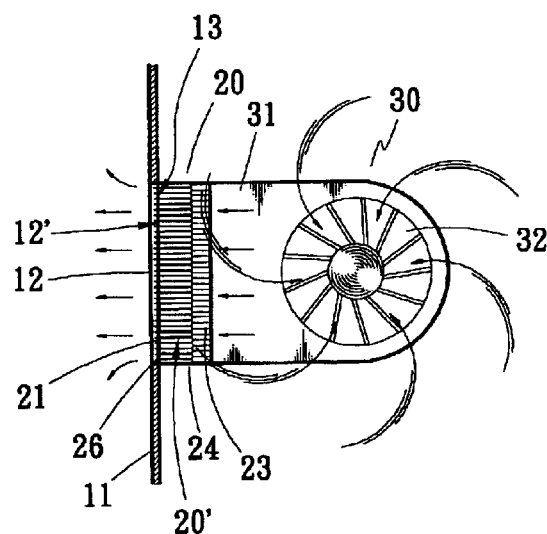
FIG. 5 is a sectional view according to FIG. 2.
Figures 1, 5:
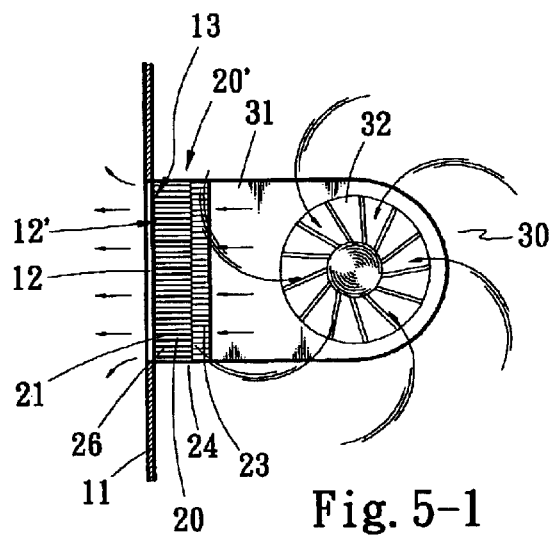

Referring to FIG. 3, the fin construction 20' further includes two bridge base sections 24 on two sides for mounting the fin construction 20' in a connecting section 31 of front end of the fan unit 30. The fan unit 30 has an air inlet 32 and an air outlet 33. The fan unit 30 is formed with a flow way for conducting the heat generated by the electronic components in the housing 10 toward the fin construction 20' as shown in FIGS. 5 and 5-1. FIG. 4 shows another embodiment of the fin construction 20', in which the bottoms 25 of the fin units 20 are connected and the adjacent fin units 20 define a regulated pitch.

Figure 6:
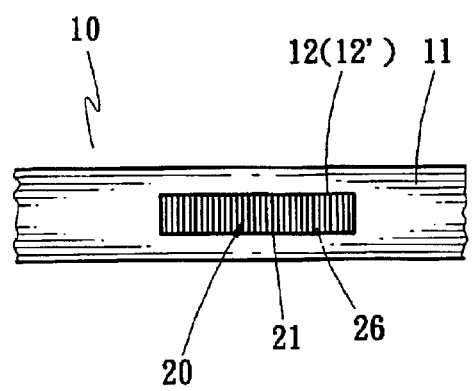
FIG. 6 shows the opening of the housing of the present invention.

Referring to FIGS. 5, 5-1 and 6, the free ends 21 of the fin units 20 or fin constructions 20' are positioned without exceeding the outer face 12' of the opening or heat-radiating window 12. Therefore, the front edges of the bridge base sections 24 and the free ends 21 of the fin construction 20' are all positioned within the area 12' or in flush with the inner face 13 of the opening or heat-radiating window 12.

The heat generated by the electronic components is conducted from the air outlet 33 of the fan unit 30 to the fin construction 20'. Thereafter, the heat is dissipated out from the opening or heat-radiating window 12 through the pitch or exhaustion gap 26 between each two adjacent fin units 20 as shown by the arrows of FIGS. 5 and 5-1.

It should be noted that the opening or heat-radiating window 12 of the housing 10 can be easily formed by plastic injection molding. Therefore, the manufacturing time is shortened and the problem of poor heat-radiation can be avoided. Moreover, the fin units 20 can be made of metal material so as to easily keep the pitch 26 under the safety standard value of 1 mm regulated by IEC. The two pieces are combined to form a heat-radiating structure which has a total weight possibly corresponding to that of the conventional device.

The above embodiments are only used to illustrate the present invention, not intended to limit the scope thereof. Many modifications of the above embodiments can be made without departing from the spirit of the present invention.

What is claimed is:

1. A heat-radiating structure co-usable with a heat-radiating window of a housing of an electronic appliance, comprising:
   a housing having a rigid wall defining an interior space, at least one side of the rigid wall being formed with an opening or a heat-radiating window; and
   multiple fin units each having a free end and a connecting end connecting with an adjacent fin unit, wherein the fin units form a series of fin constructions arranged at intervals, the adjacent fin units defining a pitch or exhaustion gap under one millimeter, the heat generated in the housing being conducted through the pitch or exhaustion gap and dissipated out from the opening, said fin units extending to said opening or heat-radiating window so that said one millimeter pitch or exhaustion gap prevents alien articles from dropping into the housing through the opening or heat-radiating window.

2. The heat-radiating structure co-usable with heat-radiating window of the housing of the electronic appliance as claimed in claim 1, wherein the connecting end of the fin unit has a bridge section extending in a direction transverse or normal to the axis of the fin unit, whereby the fin units form a series of fin constructions arranged at equal intervals to define the pitch or exhaustion gap.

3. The heat-radiating structure co-usable with heat-radiating window of the housing of the electronic appliance as claimed in claim 1, wherein the fin construction includes two bridge base sections on two sides for mounting the fin construction in a connecting section of a fan unit.

4. The heat-radiating structure co-usable with heat-radiating window of the housing of the electronic appliance as claimed in claim 1, wherein the free ends of the fin units or fin constructions are positioned without exceeding an outer face of the opening or heat-radiating window.

5. The heat-radiating structure co-usable with heat-radiating window of the housing of the electronic appliance as claimed in claim 1, wherein the free ends of the fin units or fin constructions are flush with an inner face of the opening or heat-radiating window.

6. The heat-radiating structure co-usable with heat-radiating window of the housing of the electronic appliance as claimed in claim 1, wherein the fin unit is made of metal material.

7. The heat-radiating structure co-usable with heat-radiating window of the housing of the electronic appliance as claimed in claim 1, wherein the bottoms of the fin units are connected.

8. The heat-radiating structure co-usable with heat-radiating window of the housing of the electronic appliance as claimed in claims 1 to 7, further comprising a fan unit having a connecting section at a front of the fan unit for connecting with the connecting ends of the fin constructions.

9. The heat-radiating structure co-usable with heat-radiating window of the housing of the electronic appliance as claimed in claim 6, wherein the fin unit is made of aluminum.

\* \* \* \* \*